(12) United States Patent
Cheng et al.

(10) Patent No.: US 9,211,611 B2
(45) Date of Patent: Dec. 15, 2015

(54) LASER CRYSTALLIZATION OF THIN FILMS ON VARIOUS SUBSTRATES AT LOW TEMPERATURES

(71) Applicant: Purdue Research Foundation, West Lafayette, IN (US)

(72) Inventors: Gary J. Cheng, West Lafayette, IN (US); Martin Y. Zhang, Santa Clara, CA (US)

(73) Assignee: Purdue Research Foundation, West Lafayette, IN (US)

( * ) Notice: Subject to any disclaimer, the term of this patent is extended or adjusted under 35 U.S.C. 154(b) by 524 days.

(21) Appl. No.: 13/683,898

(22) Filed: Nov. 21, 2012

(65) Prior Publication Data
US 2013/0075377 A1   Mar. 28, 2013

Related U.S. Application Data

(63) Continuation-in-part of application No. 13/113,386, filed on May 23, 2011, now Pat. No. 8,349,713.

(60) Provisional application No. 61/562,458, filed on Nov. 22, 2011, provisional application No. 61/587,971, filed on Jan. 18, 2012, provisional application No. 61/347,538, filed on May 24, 2010.

(51) Int. Cl.
| | |
|---|---|
| *C30B 1/02* | (2006.01) |
| *B23K 26/30* | (2014.01) |
| *H01L 31/0392* | (2006.01) |
| *H01L 31/18* | (2006.01) |

(52) U.S. Cl.
CPC . *B23K 26/42* (2013.01); *C30B 1/02* (2013.01); *H01L 31/0392* (2013.01); *H01L 31/1872* (2013.01); *H01L 31/1884* (2013.01); *Y02E 10/50* (2013.01)

(58) Field of Classification Search
CPC ............. C30B 1/02; C30B 1/10; C30B 1/023
See application file for complete search history.

(56) References Cited

U.S. PATENT DOCUMENTS

2014/0093744 A1* 4/2014 Hu et al. ................... 428/701

* cited by examiner

*Primary Examiner* — Robert M Kunemund
(74) *Attorney, Agent, or Firm* — Hartman Global IP Law; Gary M. Hartman; Michael D. Winter (57) ABSTRACT

A method and system are provided for crystallizing thin films with a laser system. The method includes obtaining a thin film comprising a substrate and a target layer that contains nano-scale particles and is deposited on the substrate. The heat conduction between the target layer and the substrate of the thin film is determined based on thermal input from the laser system to identify operating parameters for the laser system that cause crystallization of the nano-scale particles of the target layer in an environment at near room temperature with the substrate remaining at a temperature below the temperature of the target layer. The laser system is then operated with the determined operating parameters to generate a laser beam that is transmitted along an optical path to impinge the target layer. The laser beam is pulsed to create a localized rapid heating and cooling of the target layer.

20 Claims, 7 Drawing Sheets

LASER CRYSTALLIZATION OF THIN FILMS ON VARIOUS SUBSTRATES AT LOW TEMPERATURES

CROSS REFERENCE TO RELATED APPLICATIONS

This application claims the benefit of U.S. Provisional Application No. 61/562,458, filed Nov. 22, 2011 and U.S. Provisional Application No. 61/587,971, filed Jan. 18, 2012, the contents of which are incorporated herein by reference. In addition, this is a continuation-in-part patent application of co-pending U.S. patent application Ser. No. 13/113,386, filed May 23, 2011, which claimed the benefit of U.S. Provisional Application No. 61/347,538, filed May 24, 2010. The contents of these prior applications are incorporated herein by reference.

BACKGROUND OF THE INVENTION

The present invention generally relates to methods of inducing crystallization in thin films. More particularly, this invention relates to methods of inducing crystallization in thin films at low temperatures without causing undue damage to a substrate of the thin film.

Many thin film applications require a limited amount of defects within the thin films such as grain boundary and point defects. For example, the conversion efficiency of thin film solar cells depends on the crystallinity of photovoltaic (PV) materials (e.g., cadmium telluride (CdTE), copper indium selenide (CIS) and copper indium gallium selenide (GIGS)) that form the light absorbent layers of solar cells. Defects in the photovoltaics degrade the photon-electron conversion efficiency and transportation of electrons.

Traditional crystallization techniques used in the thin film industry, such as Rapid Thermal Annealing (RTA) techniques, have several limitations. These limitations can include issues regarding non-selective heating, slow crystal growth, temperature control for large crystal growth, and the need to use costly vacuum/inert gas environments. In particular, traditional crystallization techniques are performed in environments at between 200° C. and 600° C. Thin films are generally formed of one or more layers that are deposited on a substrate structure. Therefore, these processes are not suitable for thin films that are formed on a substrate with a melting temperature below these operational temperatures, for example, polymers.

In view of the above, it can be appreciated that there is a need for crystallization techniques that overcome one or more of these limitations, for example by being faster, more selective or lower cost. In particular, there is a need for crystallization techniques that operate at low temperatures without damaging a substrate of the thin films.

BRIEF DESCRIPTION OF THE INVENTION

The present invention provides a method and system suitable for inducing crystallization in thin films at low temperatures without damaging the substrate of the thin film.

According to a first aspect of the invention, a method is provided for inducing crystallization in thin films with a laser system. The method includes obtaining a thin film comprising a substrate and a target layer that contains nano-scale particles and is deposited on the substrate. The heat conduction between the target layer and the substrate of the thin film is determined based on thermal input from the laser system to identify operating parameters for the laser system that cause crystallization of the nano-scale particles of the target layer in an environment at near room temperature with the substrate remaining at a temperature below the temperature of the target layer. The laser system is then operated with the determined operating parameters to generate a laser beam that is transmitted along an optical path to impinge the target layer of the thin film and crystallize the target later. The laser beam is pulsed to create a localized rapid heating and cooling of the target layer.

According to a second aspect of the invention, a system is provided for inducing crystallization in a thin film that comprises a substrate and at least one target layer. The system includes a laser generating a pulsing laser beam along an optical path to impinge the target layer of the thin film wherein the laser beam creates a localized rapid heating and cooling of the target layer with the substrate remaining at a temperature below the temperature of the target layer.

A technical effect of the invention is the ability to induce crystallization in thin films at room temperature. In particular, it is believed that, by pulsing the laser according to predetermined operating parameters, a target layer within the thin film can be crystallized without undue damage to a substrate of the thin film.

Other aspects and advantages of this invention will be better appreciated from the following detailed description.

DETAILED DESCRIPTION OF THE INVENTION

The present invention is generally applicable to methods and systems suitable for inducing crystallization within thin films. This invention is particularly applicable to thin films used in applications including, but not limited to, transparent conducting oxides for transparent electrodes and display windows, thin film solar cells, and optoelectronic devices as well as photovoltaic absorbent materials such as those used in solar cells. While the present invention will be described in relation to thin films, and in particular aluminum-doped zinc oxide, it is foreseeable that the crystallization process described hereinafter may be applied to other materials and products.

Figure 1:
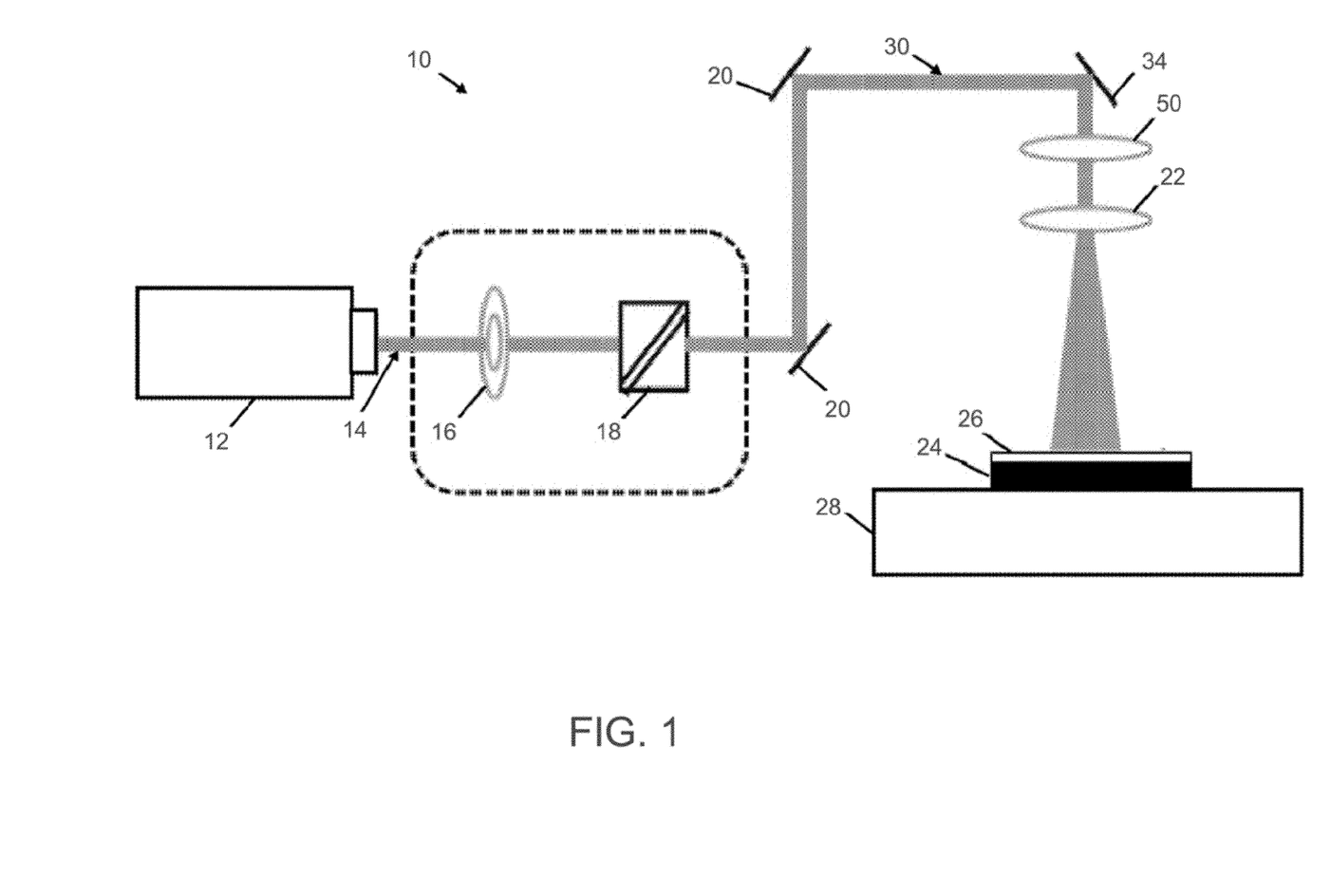
FIG. 1 schematically represents an exemplary embodiment of a laser system in accordance with an aspect of this invention.

FIG. 1 schematically represents an exemplary embodiment of the present invention wherein a laser system 10 is used for high speed laser crystallization (HSLC). The system 10 directs a laser beam 14 along an optical path 30 to impinge upon a thin film 24. The thin film 24 is covered by an optional confinement layer 26 that is transparent to the laser beam 14. The system 10 includes a laser 12 that generates the laser beam 14 and a beam expander 22 that expands the laser beam 14 before it impinges on the thin film 24. The system 10 can also include one or more optical elements, for example mirrors 20, that redirect the laser beam 14 along the optical path 30 from the laser 12 to the thin film 24. The system 10 can also include additional optical elements for focusing and attenuating the laser beam 14, for example, an aperture 16, a power attenuator 18, and/or a beam shaper 50. Laser beam spot size and shape may be regulated by the aperture 16. After the aperture 16, the power attenuator 18 comprised of a polarizer and a rotating stage serves to control the delivered laser power. The laser beam expander 22 and a laser beam scanner 34 may be used to achieve high speed processing of the thin film 16 (up to 10 m/s). During the process, the laser 12 pulses to create a localized rapid heating and cooling condition, which is advantageous for rapid growth of nanoscale crystals into large crystals, as well as for decreasing defects such as grain boundaries. As used herein, the phrase "rapid heating and cooling" is defined as less than one microsecond.

Figure 2:
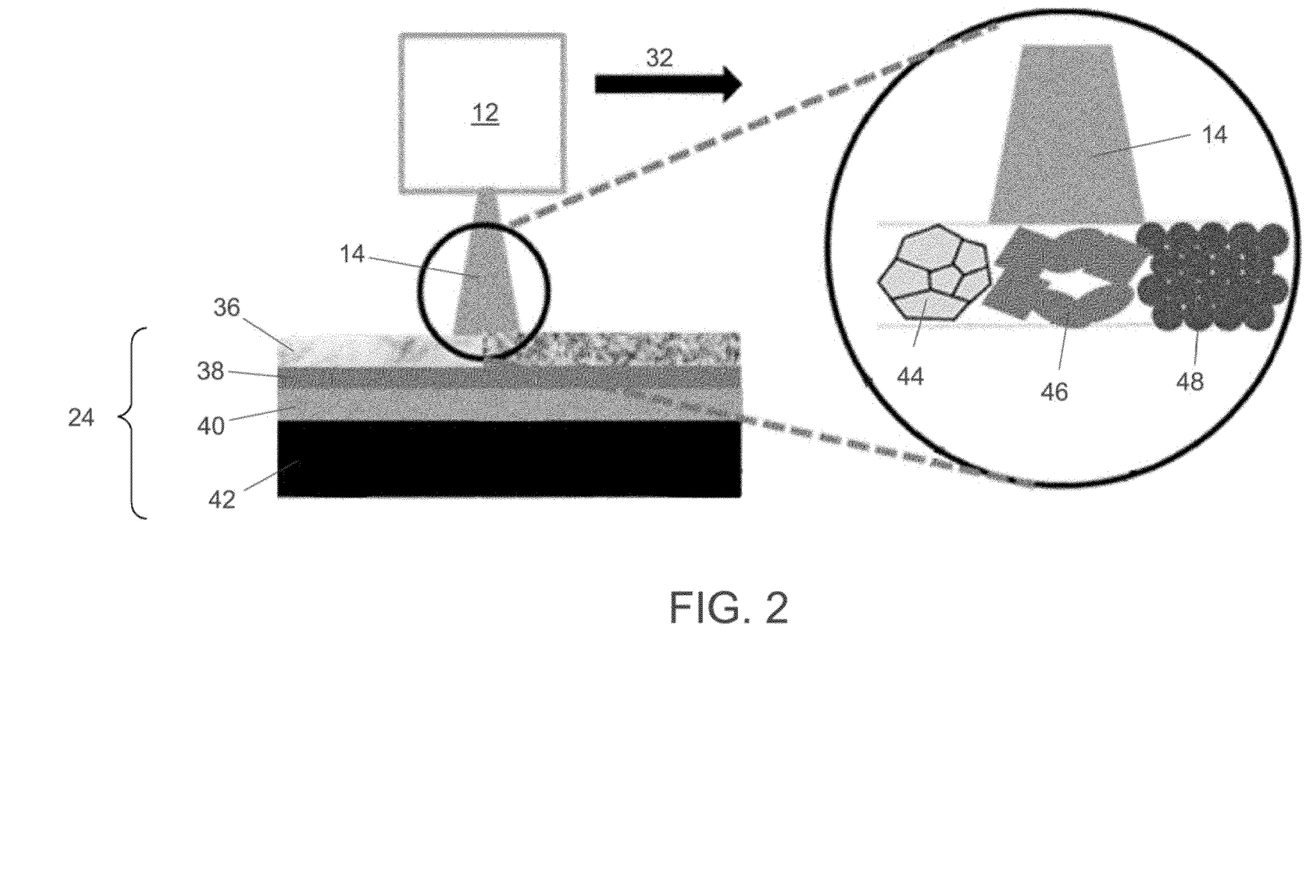
FIG. 2 is a cross-sectional view schematically representing the crystallization process within a thin film in accordance with an aspect of this invention.

FIG. 2 schematically represents an enlarged view of the laser beam 14 being directed along a direction 32 while impinging the thin film 24. The thin film 24 is represented in FIG. 2 as including a substrate 42 and at least one target layer 36, the latter of which is intended to undergo crystallization. Layers 38 and 40 in FIG. 2 are representative of additional optional layers that may be deposited if necessary based on the application of the thin film. For example, the thin film 24 may be intended for use in solar cells, in which case at least one of the layers 38 or 40 may be a photovoltaic absorbent layer.

The system 10 may be used with thin films deposited by any suitable processes known in the art including, but not limited to, physical vapor deposition (sputtered thin films, pulsed laser deposited thin films, co-evaporated thin film), atomic layer deposition (ALD), chemical bathing (such as CdS buffer layer), electrochemical deposition, and roll-to-roll printing or ink-jet printing (nanoparticles or nanowires). As previously discussed, the resulting thin film comprises one or more layers deposited on the substrate. At least the target layer 36 is formed of nano-scale particles.

The laser 12 can be a neodymium-doped yttrium aluminum garnet (Nd:YAG) laser which can generate laser beams 14 having wavelengths of, for example, 1064 nm, 532 nm or 355 nm using methods such as second harmonic generation or frequency doubling. The thin film 24 can be placed on an X-Y stage 28 (FIG. 1) adapted to move the thin film 24 as desired. The laser 12 is preferably capable of providing rapid short duration pulses (for example, 5 nsec pulses) and/or perform high speed laser scanning of the target layer 36, for example 10 m/s, by using the high speed laser beam scanner 34. The scanning can be performed by movement of the laser beam 14 or movement of the thin film 24, or both. Multiple pulse effects can be obtained by spatial overlap between pulses, which is controlled by the beam size, scanning speed and repetition rate.

The target layer 36 absorbs most of the laser energy, thereby creating a localized high-temperature within the target layer 36 that causes the target layer 36 to become more dense and smooth and forms larger crystals through grain growth. The enlarged view of FIG. 2 further represents the effect of the laser beam 14. On the right side of the enlarged view, the laser beam 14 has not yet impinged the target layer 36 and the target layer 36 comprises a plurality of tightly packed crystals 48 from the deposited particles. In the middle of the enlarged view, the laser beam 14 is impinging the target layer 36 and the target layer 36 is becoming densified to have larger crystals 46 with fewer gaps. On the left side of the enlarged view, as a result of impingement of the target layer 36 by the laser beam 14, the target layer 36 comprises larger crystals 44 with significantly fewer gaps. When the laser beam 14 passes over the entire target layer 36, the entire target layer 36 will have larger crystals similar to the crystals 44 on the left side of the enlarged view in FIG. 2.

According to preferred aspects of the invention, the laser system 10 performs a high speed laser crystallization (HSLC) process capable of increasing the size of nanocrystals (i.e., larger than 100 nm) and processing selective materials at selective locations without damaging other components. The HSLC process is preferably a rapid approach that is achieved by delivering multiple laser pulses in rapid succession (e.g., 30 pulses of 5 ns each) to a target. The crystal growth and densification are completed almost instantaneously after the pulses. HSLC does not require high temperature and can be carried out at room temperature. In addition, HSLC can often be performed without the need for a vacuum. Some materials may require a confinement layer 26 (for example, glass) over the target layer 36 or an inert gas environment in order to prevent the thin film 24 from being oxidized. In addition, a low vacuum chamber with evacuation system may be needed for processing materials that are toxic. Even so, HSLC processes that can be performed with the laser system 10 are capable of achieving substantial energy and setup savings.

Figure 3:
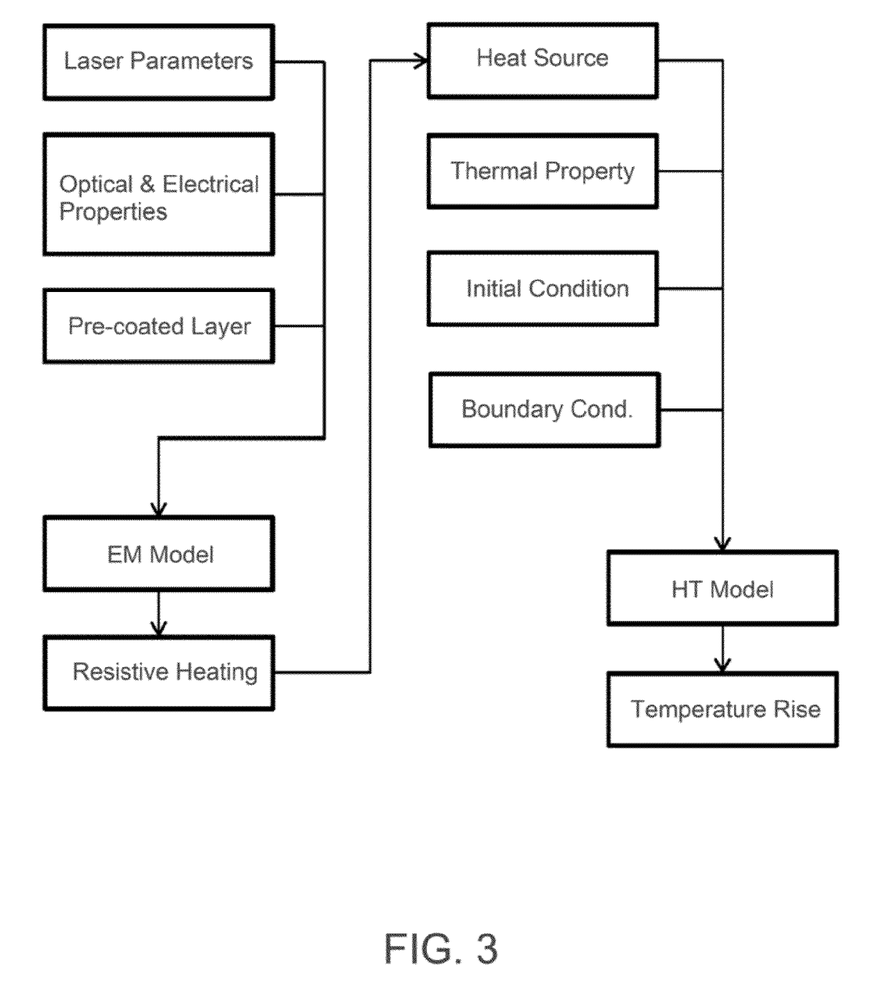
FIG. 3 is a diagram representing steps for predicting optimum operating parameters of the laser system of FIG. 1 in accordance with an aspect of this invention.

Operating parameters of the system 10 are preferably selected to minimize the heating effects on the substrate 42. For this purpose, a finite element analysis (FEA) model can be used to predict the operating parameters of the system 10 necessary to cause crystallization of the target layer 36 of the thin film 24, preferably in an environment at near room temperature and atmospheric pressure, on the particular substrate 42 to be used. An example of such a model is represented in FIG. 3. The model uses first simulates the laser-nanoparticle interaction based on parameters of the system 10 (laser power, beam radius, scan speed, etc.), optical and electrical properties of the target layer 36 (refractive of index, electrical conductivity, etc.), and pre-coated conditions of the target layer 36 (thickness, particle diameter, etc.) (This step is labeled as the EM model in FIG. 3). The model then uses the result to simulate the heat conduction from the target layer 36 to the substrate 42 as a result of laser heating based on heat sources, thermal properties of the thin film 24 (thermal conductivity, specific heat capacity, density, etc.), initial conditions of the thin film 24, and boundary conditions (This step is labeled as the HT model in FIG. 3). Resistive heating ($Q_{RH}$), i.e., the output from the first simulation, is coupled to the second simulation as the secondary heat source which eventually causes temperature elevation. Considering the size effects, calculated size dependent properties of nanomaterials are used. The laser source, initial conditions and boundary conditions can be properly selected in order to solve the model and thereby determine optimum operating parameters for the system 10 for a specific substrate 42.

Figure 4:
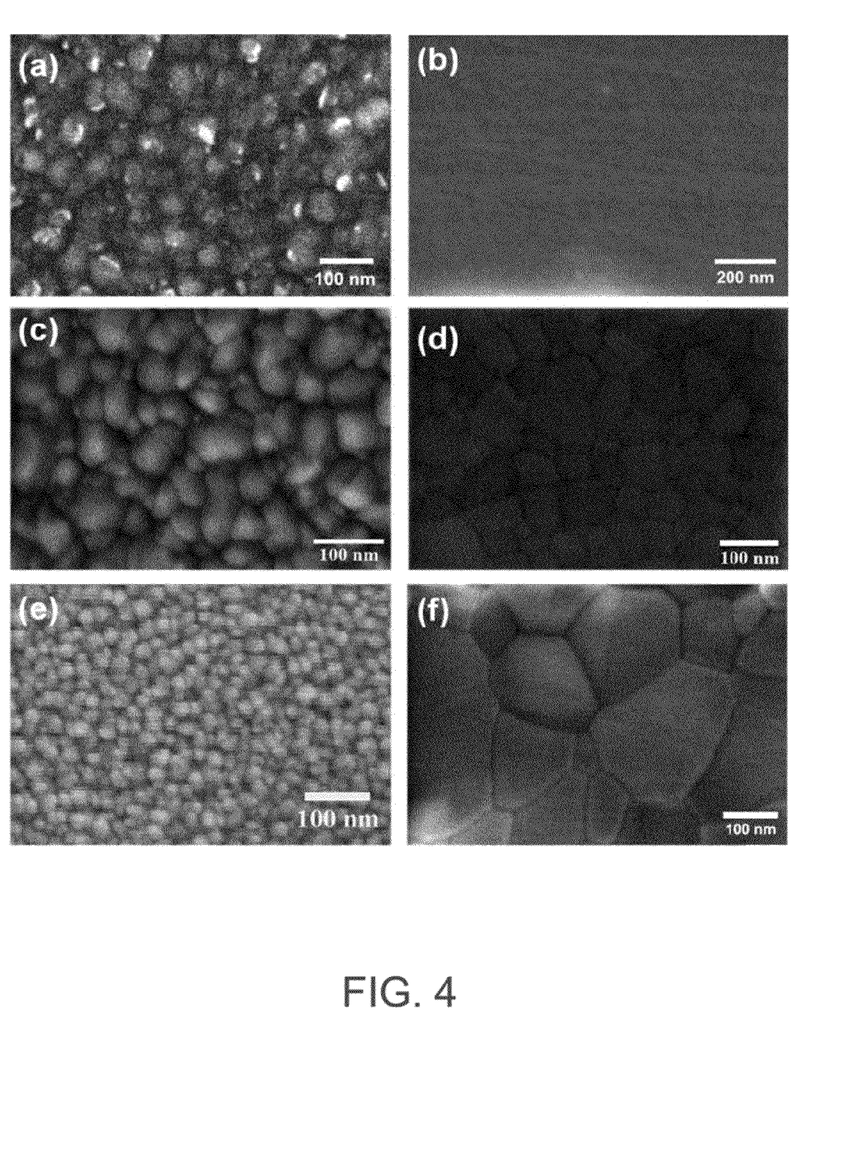
FIGS. 4(a) through 4(f) are scanned images showing surfaces of thin films after deposition on various substrates and the same surfaces after crystallization in accordance with an aspect of this invention.

The target layer 36 may be composed of various materials such as, but not limited to, an aluminum doped zinc oxide, $CuInSe_2$, CdTe, GaAs, silicon, etc. The substrate 42 may be composed of any material suitable for thin films, whether the material is rigid or flexible. Due to the low operating temperature of the HSLC process, the substrate 42 may be composed of low melting temperature materials such as plastics, polymers and papers. Other suitable materials for the substrate 42 include, but are not limited to, glass and metal foils. FIG. 4 shows scanned images of a surface of a representative transparent conducting oxide (TCO) after HSLC was performed on TCOs deposited on various substrates 42. FIG. 4(a) shows a surface after the TCO was deposited by pulsed laser deposition (PLD) onto a substrate formed of a polyimide film commercially available under the name Kapton® (registered by DuPont) and FIG. 4(b) shows the same surface after the HSLC laser performed 15 pulses on the TCO at a power level of 25 mJ/cm². FIG. 4(c) shows a surface after the TCO was deposited onto a soda lime glass (SLG) substrate by PLD and FIG. 4(d) shows the same surface after the DLPR laser performed 30 pulses on the TCO at a power level of 30 mJ/cm². FIG. 4(e) shows a surface after the TCO was deposited onto an aluminum foil substrate by PLD and FIG. 4(f) shows the same surface after the DLPR laser performed 100 pulses on the TCO at a power level of 60 mJ/cm². As evident from FIGS. 4(a)-(f), HSLC was capable to form relatively large crystals within the target layer 36 on various substrates 42.

In another exemplary investigation, a deposition method in accordance with an aspect of this invention was carried out at room temperature. Before deposition, soda lime glass sample was cleaned by acetone, methanol, and de-ionized water in an ultrasonic cleaner, sequentially. ZnO (about 99.99% pure) and Al-doped ZnO (about 2% Al and about 98% ZnO) targets were ablated using a KrF excimer laser (wavelength of about 248 nm, pulse duration of about 25 ns). The target distance was about 80 mm. The rotation of the target and sample was set to be approximately 7 and 5 RPM, respectively. An i-ZnO film (about 50 nm) was deposited with a laser fluence (F) of about 1.5 J/cm² and a repetition rate (R) of about 10 Hz for approximately 20 min. An Al-doped ZnO (about 250 nm) film was deposited by a laser fluence of about 0.5 J/cm² and a R=5 Hz for about 90 min. The i-ZnO and Al-doped Zno films were deposited in an atmosphere having an oxygen gas pressure of approximately 150 mTorr and approximately 1 mTorr, respectively. After PLD, the sample was placed in a vacuum chamber at approximately 10 mTorr. The same laser was used for HSLC with R approximately equal to 1 Hz. The laser beam was shaped to square top-hat (about 8×8 mm). The sample was placed on a motorized stage which enabled translations along both X and Y axes.

Further investigations of the HSLC of this invention were conducted on Al-doped ZnO film with laser fluence in ranges of about 20 to 200 mJ/cm² and about 10 to 150 pulses (N). The investigations found that laser fluence (F) as high as 50 mJ/cm² will lead to ablation of Al-doped ZnO. Similar results were observed in investigations on indium tin oxide films. Laser fluencies between about 25 and 30 mJ/cm² were found suitable for HSLC. However, optimal processing conditions also depend on N. For example, N=50 produces F=25 mJ/cm² and N=30 produces F=30 mJ/cm². Multiphysics electromagnetic-heat transfer (the FEA model) simulation showed that as a result of laser irradiation, the temperature of the Al-doped ZnO films increased to approximately 1695° K., 1180° K., and 850° K. in 50 ns for F=50, 30, and 20 mJ/cm², respectively. These temperatures corresponded to approximately 103% of $T_B$, approximately 85% of $T_m$, and approximately 60% of $T_m$ of Al-doped ZnO, respectively, where $T_B$ and $T_m$ stand for calibrated boiling point and melting point of Al-doped ZnO, respectively. It is believed that when the temperature is higher than $T_B$, vaporization and then ablation is expected. This explains why the ablation to Al doped ZnO is observed when F=50 mJ/cm². According to the Thornton structure zone model, crystallization is believed to occur when the temperature is above 75% of $T_m$. As thermal energy continues, large crystals tend to merge smaller counterparts until they impinge on each other. Simulations predicted that laser fluence of about 30 mJ/cm² satisfies the condition to trigger crystallization while 20 mJ/cm² does not. Both the investigations and simulations suggested that laser induced rapid melting and solidification is the driving force for Al doped ZnO crystallization and growth and that when F is between about 25 to 30 mJ/cm² the resulting temperature is higher than 75% of $T_m$ and therefore crystallization will likely occur. When F is about 20 mJ/cm², the resulting temperature is less than 60% of $T_m$ which will likely not produce crystallization. It is also worth mentioning that the temperature of the SLG substrate always stays below 470° K.

Figure 5:
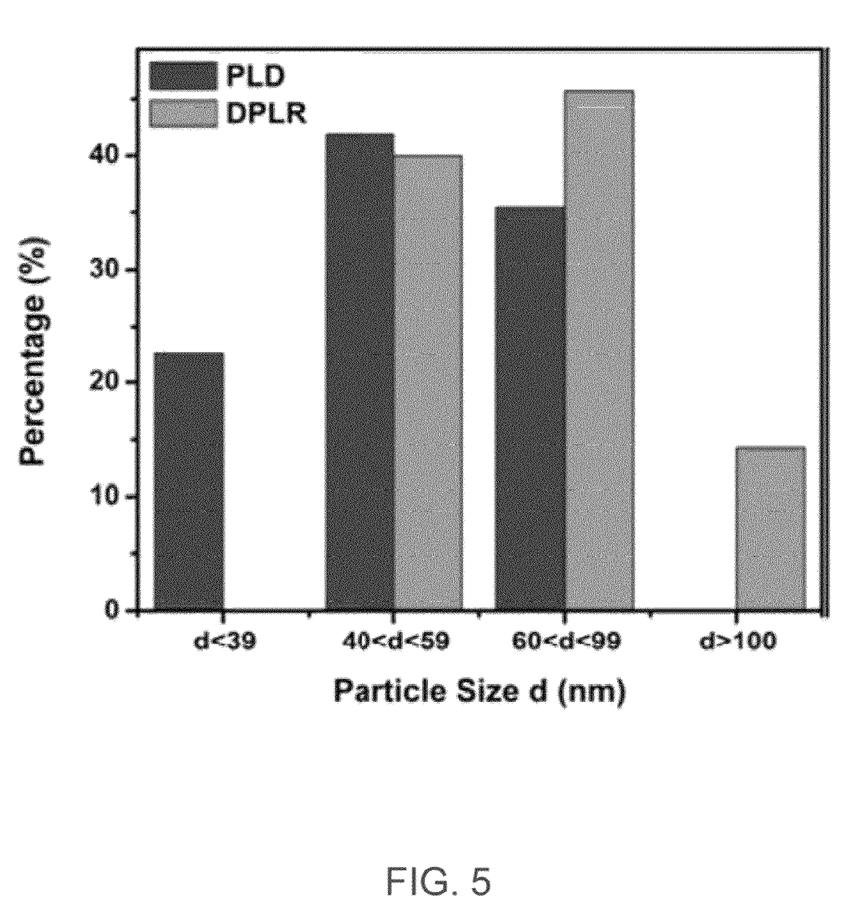
FIG. 5 is a graph representing particles sizes of aluminum-doped zinc oxide obtained during investigations leading to this invention.

The investigations showed that the deposition rate is approximately 2.5 and approximately 2.78 nm/min for i-ZnO and Al doped ZnO, respectively. Al doped ZnO films obtained from PLD displayed a columnar structure with porous structure comprised of tapered crystallites separated by internal voids. This corresponds to zone 1 of the Thornton Structure Zone model when temperature is 10%-30% of melting point of Al doped ZnO. A majority of the particles were observed to have a size of about 30 to 70 nm prior to HSLC (d denotes diameter for particles). After HSLC, Al doped ZnO experienced crystallization and growth which led to a morphological change. Instead of discrete nanoparticles, the surface was comprised of faceted and flat grains with grain boundaries. A histogram of Al doped ZnO particle/crystal size and distribution is represented in FIG. 5, which displays that after HSLC, not only did the Al doped ZnO undergo crystallization but also growth occurred to the nanoparticles. Before HSLC, roughly 23% of the particles were between 30 and 40 nm and none were above 100 nm; however, after HSLC, none of the crystals were below 40 nm (d denotes diagonal length for crystals), and 15% of the crystals were above 100 nm.

The resistivity of the Al doped ZnO film deposited by PLD was measured to be approximately $1.40 \times 10^{-3}$ Ωcm. After HSLC, the resistivity decreased in observed samples by a minimum of $2.23 \times 10^{-4}$ Ωcm. These results suggest that when nanosecond pulsed laser irradiation is used, crystallization and growth of crystals occur as a result of laser induced melting and solidification and crystallization reorganizes the microstructure of Al doped ZnO. Growth of Al doped ZnO refers to coalescence of a few nanocrystals into bigger crystals which decreases internal defects such as the inter-crystal gaps and grain boundaries.

Hall effect measurement suggested that as a result of HSLC, Hall mobility in the samples increased by two orders, from about 6.56 to to more than 100 cm²/vs, with a maximum of 382.83 cm²/vs. Carrier concentration density was determined to have dropped by two orders from about $1.098 \times 10^{21}$ to minimum of $4.375 \times 10^{19}$ cm⁻³. Starting film homogeneity, testing configurations, and laser fluence fluctuations are believed to be responsible for these variations among the samples. These measurements show that Al doped ZnO films processed by HSLC have higher Hall mobility and lower carrier concentration than those produced by prior methods known in the art. Increased Hall mobility indicates that electrons move with little resistance in the film because HSLC reduces its internal defects and increases grain size. The decrease in carrier concentration is believed to be due to high zinc vacancies, which are produced during a lack-oxygen crystallization process wherein a great amount of excited electrons are captured from the doped Al and thus the density of effective electrons is decreased. Lower carrier concentration leads to film band gap shrinkage ($\Delta E_g$), hence widening in solar spectrum acceptance.

Figure 6:
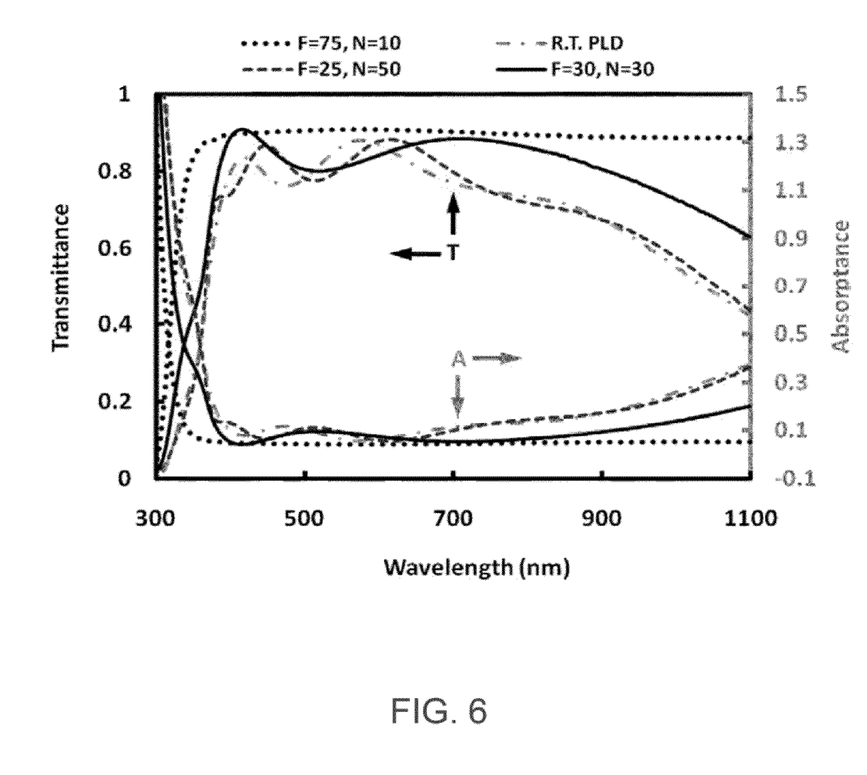
FIG. 6 is a graph representing light penetration properties of aluminum-doped zinc oxides obtained during investigations leading to this invention.

The investigations indicated that the acceptance of solar spectrum of HSLC-processed Al doped ZnO film is about 215 nm broader than that of the PLD-deposited Al doped ZnO film. Therefore, this process allows more sunlight to pass through the film which is beneficial in specific applications, such as thin film solar cells. Both transmittance and absorbance spectra of Al doped ZnO thin films deposited directly by PLD and three HSLC processing conditions are presented in FIG. 6. FIG. 6 shows that after HSLC, an aluminum doped zinc oxide film's transmission increased by 9%, 15%, and 16% in UV, visible, and NIR ranges while the optical absorption decreased significantly.

Figure 7:
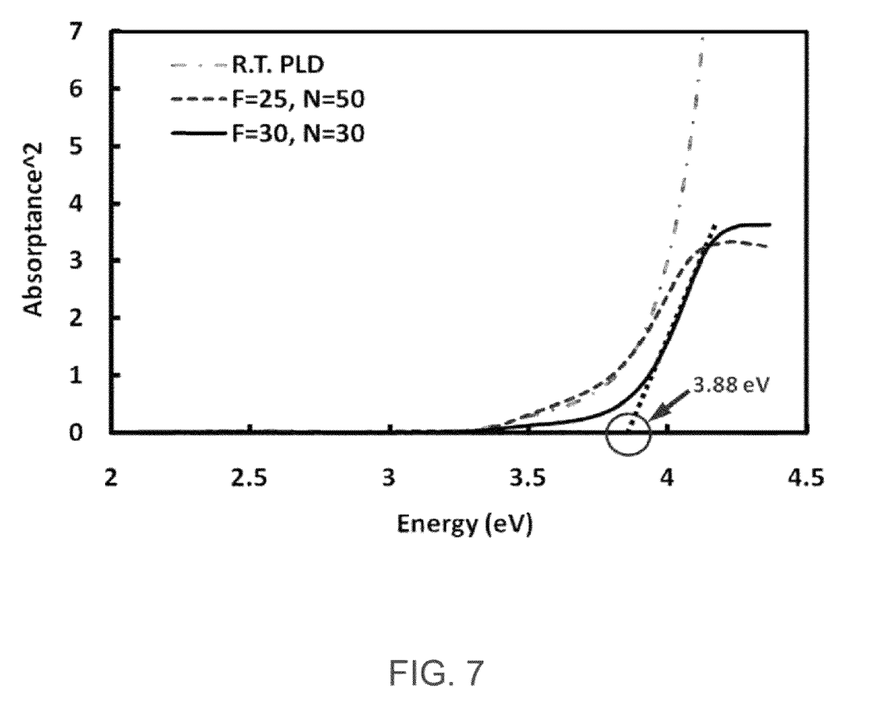
FIG. 7 is a graph representing light acceptance properties of aluminum-doped zinc oxides obtained during investigations leading to this invention.

The band gap of Al doped ZnO films was evaluated using direct band gap method by plotting the absorbance squared versus energy and extrapolating to zero. The band gaps were determined to be approximately 3.92, 3.88, and 3.71 eV for films deposited by PLD, HSLC ($F=30$ mJ/cm$^2$, $N=30$), and HSLC ($F=25$ mJ/cm$^2$, $N=50$), respectively. Band gap shrinkages were observed which is believed to correspond with the decrease in carrier concentration density (n). The Burstein and Moss model describes that band gap shrinkage ($\Delta E_g$) correlates to $n^{2/3}$. In this case, measured carrier density of Al doped ZnO films was about $4.375 \times 10^{19}$ cm$^{-3}$ after HSLC treatment. Effective mass of electrons and holes of Al doped ZnO are believed to be approximately $2.551 \times 10^{-31}$ kg and approximately $5.374 \times 10^{-31}$ kg, respectively. When substituting n with $4.375 \times 10^{19}$ in the Burstein and Moss model, it can be calculated that $\Delta E_g$ to be about 162 meV. According to the measured band gap shrinkage using optical spectra, band gap shrinkage as large as 210 meV were observed, as represented in FIG. 7, which corresponds to a 260 nm expansion of acceptable sunlight by the film. The discrepancy was expected since the $n^{2/3}$ correlation stated in Burstein and Moss model is valid for n less than $4.2 \times 10^{19}$ cm$^{-3}$. When n is slightly greater than $4.2 \times 10^{19}$, a sudden decrease in band gap is expected.

The above investigations showed that, under optimal laser processing conditions, it is possible to deposit high mobility (384 cm$^2$/vs) Al doped ZnO thin film on flexible substrates, metal foils and glass. It is believed that this is because the HLSC process removes the crystal defects such as grain boundaries, inter-crystal gaps, and vacancies.

While the invention has been described in terms of a specific embodiment, it is apparent that other forms could be adopted by one skilled in the art. For example, the physical configuration of the system 10 could differ from that shown, and materials and processes other than those noted could be used for the thin film 16. Therefore, the scope of the invention is to be limited only by the following claims.

The invention claimed is:

1. A method of inducing crystallization in thin films with a laser system, the method comprising:
    obtaining a thin film comprising a substrate and a target layer deposited on the substrate, wherein the target layer comprises nano-scale particles;
    determining the heat conduction between the target layer and the substrate of the thin film based on thermal input from the laser system to identify operating parameters for the laser system that cause crystallization and crystal growth of the nano-scale particles of the target layer in an environment at near room temperature with the substrate remaining at a temperature below the temperature of the target layer;
    transmitting a laser beam of the laser system along an optical path to impinge the target layer of the thin film; and then
    pulsing the laser beam to create a localized rapid heating and cooling of the target layer, wherein the laser system is operated at the operating parameters identified in the determining step to crystallize and induce crystal growth of the nano-scale particles of the target layer and maintain the substrate at a temperature below the temperature of the target layer.

2. The method of claim 1, wherein the target layer comprises a material chosen from the group consisting of aluminum doped zinc oxide, CuInSe$_2$, CdTe, GaAs, or silicon.

3. The method of claim 1, wherein the substrate is chosen from the group consisting of glass, metal foils, plastics, polymers, or papers.

4. The method of claim 1, further comprising expanding the laser beam to enlarge the surface region of the thin film covered by the laser beam using a beam expander.

5. The method of claim 1, further comprising scanning the laser beam across a specific region of the thin film.

6. The method of claim 1, further comprising locating a confinement layer over the thin film prior to transmitting the laser beam along the optical path, wherein the confinement layer is transparent to the laser beam and the laser beam travels through the confinement layer prior to impinging the target layer when transmitting the laser beam along the optical path.

7. The method of claim 1, wherein the laser beam is pulsed such that the target layer is heated to a temperature of at least 60 percent of a melting point of the target layer and below a boiling point of the target layer.

8. The method of claim 5, wherein obtaining the thin film comprises depositing the target layer on the substrate.

9. The method of claim 1, wherein the pulsing step comprises generating a series of pulses of the laser beam having a duration of approximately 5 nanoseconds each.

10. The method of claim 1, wherein the substrate is not damaged during the transmitting step and pulsing step.

11. A system comprising:
    a thin film comprising a substrate and at least one target layer, the target layer comprising nano-scale particles therein;
    a laser generating a pulsing laser beam along an optical path to impinge the target layer of the thin film and locally and rapidly heat and cool the target layer while the substrate is at a temperature below the temperature of the target layer such that crystallization and crystal grow of the nano-scale particles occurs in the target layer.

12. The system of claim 11, further comprising means for scanning the laser beam across a specific region of the thin film.

13. The system of claim 11, further comprising a confinement layer over the thin film, the confinement layer being transparent to the laser beam and the laser beam traveling through the confinement layer prior to impinging the target layer when the laser generates the pulsed laser beam.

14. The system of claim 11, wherein the laser is configured to pulse the laser beam such that the target layer is heated to a temperature of at least 60 percent of a melting point of the target layer and below a boiling point of the target layer.

15. The method of claim 11, wherein the thin film was formed by a process comprising depositing the target layer on the substrate.

16. The system of claim 11, further comprising a beam expander adapted to enlarge the surface area of the thin film covered by the laser beam.

17. The system of claim 11, wherein the target layer comprises a material chosen from the group consisting of aluminum doped zinc oxide, CuInSe$_2$, CdTe, GaAs, or silicon.

18. The system of claim 11, wherein the substrate is chosen from the group consisting of glass, metal foils, plastics, polymers, or papers.

19. The system of claim 11, wherein the laser is a neodymium-doped yttrium aluminum garnet (Nd:YAG) laser.

20. The method of inducing crystallization in thin films with the laser system of claim 11, the method comprising:
- obtaining the thin film, wherein the target layer comprises nano-scale particles;
- determining the heat conduction between the target layer and the substrate of the thin film based on thermal input from the laser system to identify operating parameters for the laser system that cause crystallization and crystal growth of the nano-scale particles of the target layer in an environment at near room temperature with the substrate remaining at a temperature below the temperature of the target layer;
- transmitting the laser beam of the laser system along an optical path to impinge the target layer of the thin film; and then
- pulsing the laser beam to create a localized rapid heating and cooling of the target layer, wherein the laser system is operated at the operating parameters identified in the determining step to crystallize and induce crystal growth of the nano-scale particles of the target layer and maintain the substrate at a temperature below the temperature of the target layer.

* * * * *